United States Patent
Fujikawa et al.

(10) Patent No.: US 11,078,598 B2
(45) Date of Patent: Aug. 3, 2021

(54) METHOD FOR PRODUCING SILICON CARBIDE SINGLE CRYSTAL

(71) Applicant: SHOWA DENKO K.K., Tokyo (JP)

(72) Inventors: Yohei Fujikawa, Hikone (JP); Hidetaka Takaba, Kariya (JP)

(73) Assignee: SHOWA DENKO K.K., Tokyo (JP)

( * ) Notice: Subject to any disclaimer, the term of this patent is extended or adjusted under 35 U.S.C. 154(b) by 233 days.

(21) Appl. No.: 16/468,413

(22) PCT Filed: Dec. 15, 2017

(86) PCT No.: PCT/JP2017/045090
§ 371 (c)(1),
(2) Date: Jun. 11, 2019

(87) PCT Pub. No.: WO2018/123652
PCT Pub. Date: Jul. 5, 2018

(65) Prior Publication Data
US 2019/0301051 A1    Oct. 3, 2019

(30) Foreign Application Priority Data
Dec. 26, 2016  (JP) .............................. JP2016-251177

(51) Int. Cl.
*C30B 29/36* (2006.01)
*C30B 23/06* (2006.01)
*C30B 23/00* (2006.01)

(52) U.S. Cl.
CPC ............ *C30B 29/36* (2013.01); *C30B 23/005* (2013.01); *C30B 23/06* (2013.01)

(58) Field of Classification Search
CPC ........ C30B 23/005; C30B 23/06; C30B 29/36
See application file for complete search history.

(56) References Cited

U.S. PATENT DOCUMENTS

2003/0054660 A1* 3/2003 Kuriyama ............... C30B 23/00
                                                          438/758
2006/0042540 A1  3/2006 Futatsuyama et al.

FOREIGN PATENT DOCUMENTS

CN  101680112 A  3/2010
CN  102395716 A  3/2012
(Continued)

OTHER PUBLICATIONS

Ku et al., "High Quality SiC Crystals grown by the Physical Vapor Transport Method with a New Crucible Design", Materials Science Forum, Oct. 15, 2006, vols. 527-529, pp. 83-86 (total 5 pages).
(Continued)

*Primary Examiner* — Matthew J Song
(74) *Attorney, Agent, or Firm* — Sughrue Mion, PLLC (57) ABSTRACT

A silicon carbide single crystal is grown by a method comprising: a single crystal growth step of growing a silicon carbide single crystal so as to not close a gap between a side surface of the silicon carbide single crystal growing on a silicon carbide seed crystal, and an inner-side surface of a guide member and a crystal deposited on the inner-side surface of the guide member; a crystal growth termination step of terminating crystal growth by temperature lowering; and a gap enlargement step, performed between the single crystal growth step and the crystal growth termination step, of enlarging the gap by maintaining a difference, Pin−Pout, between partial pressure Pin of $Si_2C$ in a source gas in the vicinity of an inlet of the gap and partial pressure Pout of $Si_2C$ in a source gas in the vicinity of an outlet of the gap at 0.18 torr or less.

6 Claims, 3 Drawing Sheets

(56) References Cited

FOREIGN PATENT DOCUMENTS

| | | | | |
|---|---|---|---|---|
| CN | 102459718 A | 5/2012 | | |
| CN | 105008596 A | 10/2015 | | |
| JP | 2002-060297 A | 2/2002 | | |
| JP | 2005-225710 A | 8/2005 | | |
| JP | 2006-089365 A | 4/2006 | | |
| JP | 2007077017 A | * 3/2007 | ............ | C30B 29/36 |
| JP | 3961750 B2 | 8/2007 | | |
| JP | 2008-169098 A | 7/2008 | | |
| JP | 2008-266116 A | 11/2008 | | |
| JP | 2008-280206 A | 11/2008 | | |
| JP | 2012-201584 A | 10/2012 | | |
| JP | 2012-254892 A | 12/2012 | | |
| JP | 2015-20938 A | 2/2015 | | |
| JP | 2016-011215 A | 1/2016 | | |
| JP | 2016204197 A | * 12/2016 | ............ | C30B 29/36 |

OTHER PUBLICATIONS

Communication dated Aug. 24, 2020 from the State Intellectual Property Office of the P.R.C. in Application No. 201780075628.X.
International Search Report of PCT/JP2017/045090 dated Mar. 6, 2018 [PCT/ISA/210].

* cited by examiner

METHOD FOR PRODUCING SILICON CARBIDE SINGLE CRYSTAL

CROSS REFERENCE TO RELATED APPLICATIONS

This application is a National Stage of International Application No. PCT/JP2017/045090, filed Dec. 15, 2017, claiming priority to Japanese Patent Application No. 2016-251177, filed Dec. 26, 2016, the contents of all of which are incorporated herein by reference in their entirety.

TECHNICAL FIELD

The present invention relates to a method for producing a silicon carbide single crystal.

BACKGROUND ART

Silicon carbide (SiC) has a dielectric breakdown electric field that is an order of magnitude larger than that of silicon (Si), and a band gap that is three times larger than that of silicon (Si). Further, silicon carbide (SiC) has characteristics such as a thermal conductivity that is about three times higher than that of silicon (Si). Silicon carbide (SiC) holds much promise for applications to power devices, high-frequency devices, and high-temperature operation devices and the like.

Silicon carbide single crystals are produced by the sublimation method. The sublimation method uses a gas containing a sublimated source to effect crystal growth on a seed crystal.

Known as an effective method for extending the length of silicon carbide single crystals is a method that uses a cylindrical or tapered guide member for controlling the flow of a source gas inside a crucible to efficiently collect the source gas on the seed crystal (for example, see Patent Documents 1 to 3).

PRIOR ART LITERATURE

Patent Documents

Patent Document 1: Japanese Patent (Granted) Publication No. 3,961,750
Patent Document 2: Japanese Unexamined Patent Application, First Publication No. 2005-225710
Patent Document 3: Japanese Unexamined Patent Application, First Publication No. 2012-254892

SUMMARY OF THE INVENTION

Problems to be Solved by the Invention

When a source gas does not contribute to the growth of a silicon carbide single crystal, the gas crystallizes on members on the periphery of the seed crystal and the inner wall of the crucible and forms a polycrystal. In methods for producing a silicon carbide single crystal using a guide member, a polycrystal that has deposited on the inner wall of the guide member can sometimes come into contact with a single crystal grown on the seed crystal and result in the quality being adversely affected due to the formation of cracks in the silicon carbide single crystal and the like. This becomes a particularly severe problem when single crystals are made longer.

In order to counteract this, for example, proposed in Patent Document 2 is the installation of a heat insulating material on the outer wall of the guide member to enable the temperature of the inner wall of the guide member to be made higher than the temperature of the outer peripheral surface of the silicon carbide single crystal. This method is based on an understanding that the reason for adhesion between the silicon carbide single crystal, and the inner wall of the guide member and the polycrystal that has deposited on the inner wall is because the temperature of the outer peripheral surface of the silicon carbide single crystal and the temperature of the inner wall of the guide member are substantially equivalent. This method suppresses the deposition of a polycrystal on the inner wall of the guide member as much as possible, and is therefore considered to be appropriate for avoiding adhesion between a silicon carbide single crystal and a polycrystal that has deposited on the inner wall of the guide member during the growth process.

However, despite adhesion not occurring between the silicon carbide single crystal and the polycrystal that has deposited on the inner wall of the guide member, if the growth of the silicon carbide single crystal is terminated in a state where the crystal is in contact with or in close proximity to the polycrystal, this can cause the occurrence of defects and polytype inclusion, and can become the originating point of cracks and the like, which is problematic. The method described in Patent Document 2, which avoids adhesion during the growth process, is unable to solve these problems. Further, extension of the length of silicon carbide single crystals has progressed since the time of filing of Patent Document 2, and the gap between the silicon carbide single crystal and the polycrystal that has deposited on the inner wall of the guide member often becomes even narrower. Therefore, the growth of silicon carbide single crystals is often terminated in a state where the silicon carbide single crystal and the guide member are in contact or in close proximity, and the importance of solving these problems has increased.

The inventors of the present invention have arrived at the present invention as a result of intensive investigation into methods that maintain the gap between the silicon carbide single crystal and the polycrystal that has deposited on the inner wall of the guide member at an appropriate distance, or even expand that gap. That is to say, the gap between the silicon carbide single crystal and the polycrystal that has deposited on the inner wall of the guide member becomes narrower due to growth at the side surface of the silicon carbide single crystal and growth of the polycrystal on the inner wall of the guide member. The inventors completed the present invention by developing and implementing a concept which is based on expanding the gap by carrying out a step for etching the side surface of the silicon carbide single crystal and the polycrystal on the inner wall of the guide member prior to termination of the growth of the silicon carbide single crystal, and terminating the growth of the silicon carbide single crystal thereafter.

The present invention has been developed in light of the above problems, and has an object of providing a method for producing a silicon carbide single crystal capable of producing a silicon carbide single crystal having a suppressed occurrence of cracking.

Means for Solving the Problems

The present invention provides the following means for solving the above problems.

(1) A method for producing a silicon carbide single crystal according to a first aspect of the present invention is a method for producing a silicon carbide single crystal in which a single crystal of silicon carbide is grown on a silicon carbide seed crystal placed inside a crucible by using a guide member to guide a source gas to the silicon carbide seed crystal side, wherein the guide member has one end positioned in the vicinity of the silicon carbide seed crystal, the method comprising:

a single crystal growth step of growing a silicon carbide single crystal in a manner so as to not completely close a gap between a side surface of the silicon carbide single crystal growing on the silicon carbide seed crystal, and an inner-side surface of the guide member and a crystal deposited on the inner-side surface of the guide member;

a crystal growth termination step of terminating crystal growth by lowering a temperature;

and a gap enlargement step, performed between the single crystal growth step and the crystal growth termination step, of enlarging the gap by maintaining a difference, Pin−Pout, between a partial pressure Pin of $Si_2C$ in a source gas in the vicinity of an inlet of the gap and a partial pressure Pout of $Si_2C$ in a source gas in the vicinity of an outlet of the gap, at 0.18 torr or less.

The production method of the first aspect described above preferably includes the following conditions. These characteristics are also preferably combined with each other.

(2) In the method for producing a silicon carbide single crystal according to (1) above, the gap enlargement step may be performed for at least 5 hours.

(3) In the method for producing a silicon carbide single crystal according to (1) or (2) above, the gap enlargement step may be performed for a period of at least 5% of a time required for the total crystal growth.

(4) In the method for producing a silicon carbide single crystal according to any one of (1) or (3) above, a silicon carbide single crystal having a single crystal length of at least 15 mm may be produced.

(5) In the method for producing a silicon carbide single crystal according to any one of (1) or (4) above, a silicon carbide single crystal may be produced at an average growth rate of at least 0.15 mm/h.

(6) In the method for producing a silicon carbide single crystal according to any one of (1) or (5) above, a temperature difference between the temperature of a source gas in the vicinity of an inlet of the gap and the temperature in the vicinity of an outlet of the gap during the gap enlargement step may be smaller than the temperature difference between the temperature of a source gas in the vicinity of an inlet of the gap and the temperature in the vicinity of an outlet of the gap during the single crystal growth step.

Effects of the Invention

According to the method for producing a silicon carbide single crystal of the present invention, a method for producing a silicon carbide single crystal capable of producing a silicon carbide single crystal having a suppressed occurrence of cracking can be provided.

EMBODIMENTS FOR CARRYING OUT THE INVENTION

Preferred examples of the present invention are described in detail below with appropriate reference to the drawings. The drawings used in the following description may be drawn with specific portions enlarged to facilitate comprehension of the features of the present invention, and the dimensional ratios and the like between the constituent elements may differ from the actual values. The materials and dimensions and the like presented in the following description are merely examples, which in no way limit the present invention, and may be altered as appropriate within the scope of the present invention. For example, the present invention is not limited to the following examples, and additions, omissions, substitutions, changes to numerical values, and other alterations may be made to the configurations within a scope that does not depart from the gist of the present invention.

(Silicon Carbide Single Crystal Production Device)

Figure 1:
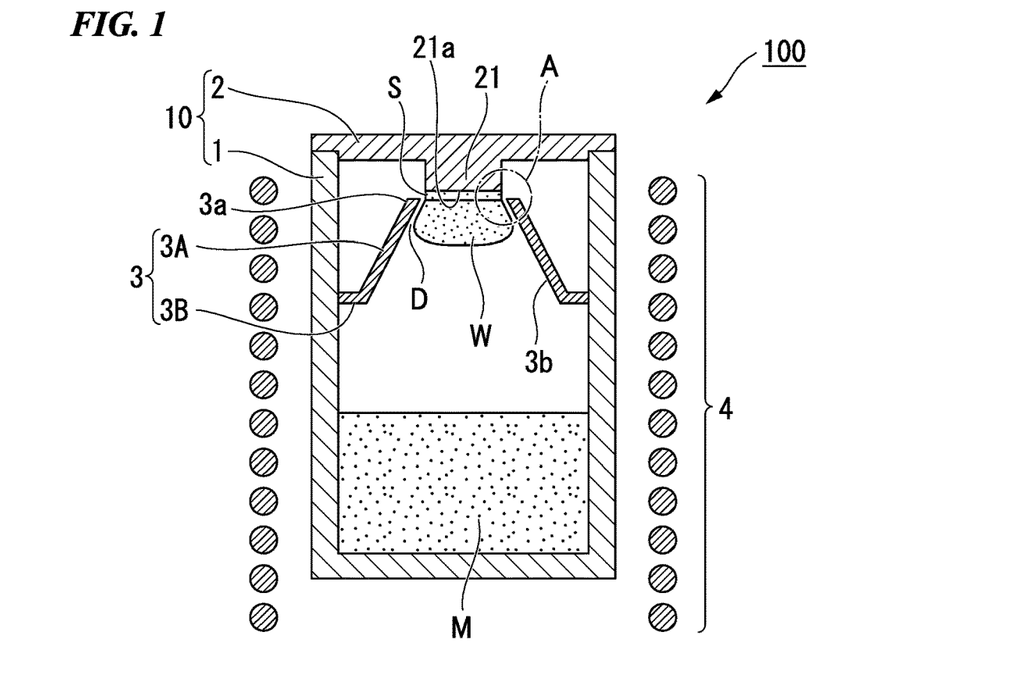
FIG. 1 is a longitudinal cross-sectional schematic view showing one example of a silicon carbide single crystal production device capable of being used in the method for producing a silicon carbide single crystal of the present invention.

FIG. 1 shows a longitudinal cross-sectional schematic view of one preferred example of a silicon carbide single crystal production device capable of being used in the method for producing a silicon carbide single crystal of the present invention.

The silicon carbide single crystal production device 100 comprises a crucible 10 (constituted by a crucible body 1 and a crucible lid 2) and a guide member 3. A heating element 4 and a heat insulating material (not shown in the drawing) which thermally insulate the crucible 10 when heated are provided on the periphery of the crucible body 1. To aid comprehension, FIG. 1 collectively illustrates a source for silicon carbide single crystal growth M, a silicon carbide seed crystal (sometimes simply referred to as a "seed crystal" below) S, and a silicon carbide single crystal W grown from the seed crystal S. The source for silicon carbide single crystal growth M is housed on a lower portion of the crucible body 1. The seed crystal S is placed on a base 21 provided on the lid 2.

In the description below, the vertical direction denotes the direction in which the base 21 and the source for silicon carbide single crystal growth M face each other, and the direction perpendicular to the vertical direction is referred to as the horizontal direction. The direction toward the base 21 is sometimes referred to as up, and the direction toward the source M is sometimes referred to as down.

A known product may be used as the crucible 10, provided the crucible is capable of producing a silicon carbide single crystal by the sublimation method. For example, graphite and tantalum carbide crucibles can be used. The crucible 10 is subjected to high temperatures during growth. Consequently, the crucible must be formed from a material that is capable of surviving high temperatures. For example, graphite has an extremely high sublimation temperature of 3,550° C., and is capable of surviving the high temperatures during growth.

An inner central portion of the crucible lid 2 is provided with a downwardly protruding base 21. The silicon carbide seed crystal S is joined with one surface (seed crystal side surface) 21a of the base 21. As a result of the crucible body 1 being covered by the crucible lid 2, the base 21 faces the source for silicon carbide single crystal growth M stored inside the crucible 10. A source gas can be efficiently supplied to the seed crystal S due to the source for silicon carbide single crystal growth M and the seed crystal S placed on the base 21 facing each other. The crucible lid 2 and the base 21 may be formed by a single member, or may be separate members.

The base 21 is preferably provided on the center of the crucible lid 2 in the horizontal direction. The growth rate of the silicon carbide single crystal W can be made constant in the horizontal direction as a result of the base 21 being provided on the center of the crucible lid 2 in the horizontal direction.

The crucible lid 2 and the base 21 are not particularly limited, provided they are capable of surviving high temperatures. The crucible lid 2 and the base 21 may use the same material as the crucible 10.

The guide member 3 has a cylindrical portion 3A and a support 3B. The cylindrical portion 3A extends from the vicinity of the base 21 toward the side wall of the crucible body 1.

The diameter of the crucible lid 2 is larger than the diameter of the base 21. Consequently, the cylindrical portion 3A is preferably formed expanding from the vicinity of the base 21 toward the side wall of the crucible body 1. The cylindrical portion 3A is preferably formed around the entire circumference of the base 21. The inside of the cylindrical portion 3A may be a smoothly curved surface like the inner surface of a funnel. As a result of providing the cylindrical portion 3A around the entire circumference, the diameter of the silicon carbide single crystal W undergoing crystal growth from the seed crystal S placed on the base 21 can be expanded in any circumferential direction. If the cylindrical portion 3A has an inclined (expanded) configuration, the inclination angle is preferably the same even in cases where the cylindrical portion 3A is cut on any plane which is perpendicular to the base 21. The rate at which the diameter of the silicon carbide single crystal W expands can be made constant if the inclination angle is equivalent.

The configuration of the support 3B is not particularly limited, provided the cylindrical portion 3A is capable of being supported between the crucible body 1 and the crucible lid 2. The support 3B may be a rod-shaped member or a plate-shaped member, and may also be a cylindrical member connected to the entire surface of the end portion of the cylindrical portion 3A.

The source gas (such as Si, $SiC_2$, and $Si_2C$) generated from the source for silicon carbide single crystal growth M is supplied to the silicon carbide single crystal W on the lower-temperature side. At this point, the source gas is generated and supplied while also reacting with the C of the graphite crucible, and while preserving a balance between the respective gas types inside the chamber. Among the types of source gases, $Si_2C$ has a bond angle close to the crystal structure of silicon carbide. Consequently, $Si_2C$ is considered to most directly contribute to crystal growth. Although the partial pressure of Si in the source gas is high due to the high vapor pressure at the temperature at which silicon carbide single crystal growth is performed, the contribution toward the growth of silicon carbide is lower than that of $Si_2C$ and is indirect. The source M and the source gas are not particularly limited, provided they are capable of forming a silicon carbide single crystal, and favorable substances may be selected as required.

The guide member 3 controls the flow of the source gas (such as Si, $SiC_2$, and $Si_2C$) between the crucible body 1 and the crucible lid 2. Consequently, the silicon carbide single crystal W undergoes crystal growth along the cylindrical portion 3A.

The guide member 3 is also preferably formed from a material that is stable at high temperatures and generates only a small amount of impurity gases. Graphite or graphite coated with tantalum carbide (TaC) and the like are preferably used as the material of the guide member 3.

If the guide member 3 is a member consisting of graphite coated with tantalum carbide (TaC), at least coating the surfaces facing the silicon carbide seed crystal side with tantalum carbide is effective. The reason for coating with tantalum carbide is because of the possibility that, if the carbon of the graphite is exposed, the source gas may react with the carbon and result in the introduction of carbon inclusions into the growing single crystal. That is to say, the tantalum carbide coating is provided to prevent reductions in quality due to the presence of inclusions. Tantalum carbide is capable of surviving high temperatures, and also does not participate in unnecessary reactions with the source gas. Therefore, high-quality silicon carbide single crystal growth can be stably performed using the configuration described above.

Known products may be used as the heating element 4 and the heat insulating material. For example, a high-frequency coil may be used as the heating element 4.

Figure 2:
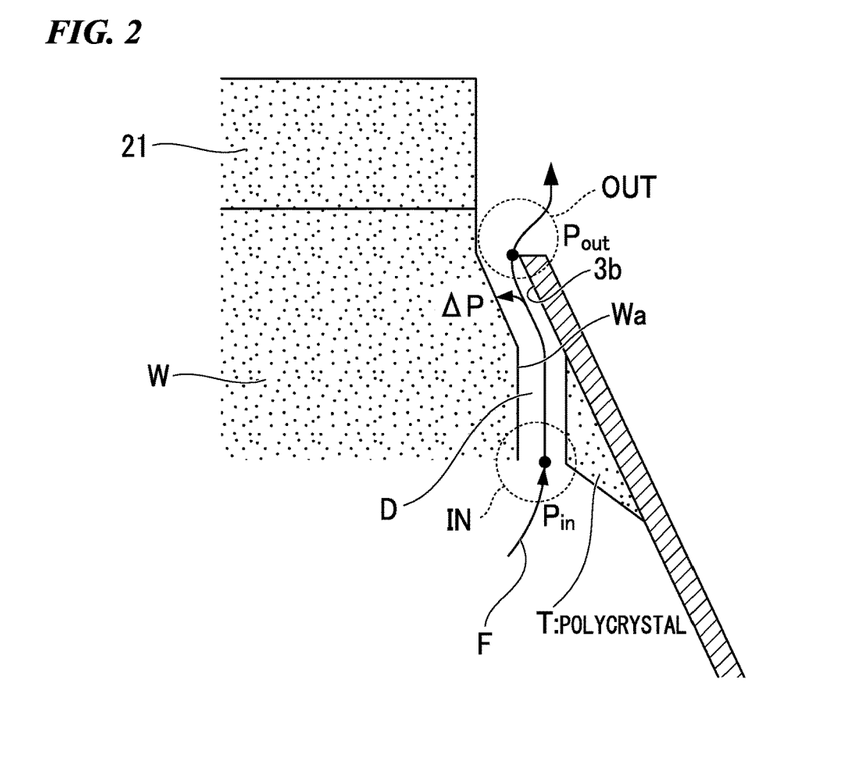
FIG. 2 is a schematic enlarged view of section A indicated by the dotted line in FIG. 1.

FIG. 2 is an enlarged view of section A indicated by the dotted line in FIG. 1.

In FIG. 2, a flow F of the source gas in a gap D between a side surface Wa of the silicon carbide single crystal W, and the inner-side surface 3b of the guide member 3 and the polycrystal T deposited on the inner-side surface 3b is indicated by an arrow.

Here, according to gas phase growth theory, the growth rate associated with gas phase growth is expressed by the Hertz-Knudsen formula below.

$$R = \frac{v(P - P^*)}{\sqrt{2\pi mkT}} \qquad \text{[Equation 1]}$$

Here, R is the growth rate, v is the product of the proportion of the injection flow rate that is introduced into the solid phase and the molecular volume, P is the pressure of the gas, P* is the equilibrium vapor pressure of the gas coexisting with the solid, in is the molecular weight, k is the Boltzmann constant, and T is the temperature.

Based on the Hertz-Knudsen formula, the growth rate associated with gas phase growth correlates with the difference between the pressure P of the gas and the equilibrium vapor pressure P* of the gas coexisting with the solid.

Although the Hertz-Knudsen formula is derived based on a theoretical model, it is considered to fundamentally capture the actual phenomenon. Therefore, based on this formula, for the side surface growth of the single crystal at the side surface Wa of the silicon carbide single crystal W and the polycrystal growth at the inner-side surface 3b of the guide member 3, the crystal growth can be considered to be proportional to the difference between the partial pressure P of the source gas and the equilibrium vapor pressure P* of the source gas in coexistence with the silicon carbide crystal, assuming that the gas pressure P in the Hertz-Knudsen formula is the partial pressure of the source gas.

Based on this approach, the inventors of the present invention intensively investigated the relationship between the pressure in the vicinity of the gap D and the narrowing of the gap D (in other words, the side surface growth of the single crystal at the side surface Wa of the silicon carbide single crystal W and the polycrystal growth at the inner-side surface 3b of the guide member 3). As a result, it was found that by controlling the growth environment such that the difference Pin−Pout (=ΔP) between the partial pressure Pin of $Si_2C$ in the source gas in the vicinity of the inlet IN of the gap D and the partial pressure Pout of $Si_2C$ in the source gas in the vicinity of the outlet OUT of the gap D is made a predetermined value or less, the occurrence of cracking can be suppressed at the termination of crystal growth and during subsequent single crystal treatment.

On the basis of the Hertz-Knudsen formula, a proportion corresponding to P-P* of the source gas that reaches the growth surface can be considered to contribute to crystal growth, while a proportion corresponding to the remaining gas P* passes through the gap. Consequently, Pin is considered to be effectively the same value as the equilibrium vapor pressure P*in at the gap inlet. Similarly, Pout is considered to be effectively the same value as the equilibrium vapor pressure P*out at the gap outlet. Therefore, the effects of the present invention can be verified using P*in and P*out.

The interior of the crystal growth vessel during crystal growth of silicon carbide is a high temperature exceeding 2,000° C. Consequently, actual measurement of the parameters inside the vessel is very difficult. As a result, gas phase crystal growth analysis that uses simulations plays a large role when designing the vessel structure and the configuration of the heating system and the like. That is to say, a method is generally adopted where the vessel structure and the like are designed based on knowledge obtained from simulations, the effects are confirmed by actually performing single crystal growth using that structure, and an optimal structure is then found by performing further structural refinements and the like based on the results. Simulations are essential for avoiding unnecessary trial and error. Future efforts to enlarge the diameter of silicon carbide single crystals will likely take maximum advantage of simulations and proceed without unnecessary trial and error. Full use of simulations was made in arriving at the present invention.

The simulations were performed using the gas phase crystal growth analysis software "Virtual Reactor" manufactured by STR-Group Ltd.

The following operations were performed in the experiments used to arrive at the present invention. A silicon carbide single crystal was actually grown, and following growth termination and before entering the cooling step, the shapes of the completed silicon carbide single crystal and polycrystal that had deposited on the guide member were drawn (see FIG. 3) and read into the simulation software. Then, the partial pressure of $Si_2C$ gas in the vicinity of the gap D for those shapes was repeatedly investigated through simulations. As a result, the inventors arrived at the present invention.

(Method for Producing Silicon Carbide Single Crystal)

The method for producing a silicon carbide single crystal is described with reference to FIG. 1 and FIG. 2.

The method for producing a silicon carbide single crystal of the present invention is a method for producing a silicon carbide single crystal in which a single crystal of silicon carbide is grown on a silicon carbide seed crystal S placed inside a crucible 10 by using a guide member 3 to guide a source gas to the silicon carbide seed crystal side, with the guide member 3 having one end 3a is positioned in the vicinity of the silicon carbide seed crystal S. The production method comprises: a single crystal growth step for growing a silicon carbide single crystal W in a manner so as to not completely close a gap D between a side surface Wa of the silicon carbide single crystal W growing on the silicon carbide seed crystal S, and an inner-side surface 3b of the guide member 3 and a crystal T deposited on the inner-side surface 3b of the guide member 3 (step 1); and a crystal growth termination step for terminating crystal growth by lowering the temperature (step 3). Further, the production method comprises a gap enlargement step, performed between the single crystal growth step and the crystal growth termination step, for enlarging the gap D by maintaining a difference, Pin−Pout, between a partial pressure Pin of $Si_2C$ in a source gas in the vicinity of an inlet IN of the gap D and a partial pressure Pout of $Si_2C$ in a source gas in the vicinity of an outlet OUT of the gap D at 0.18 ton or less (step 2).

In the present invention, a state "to not completely close a gap between a side surface of the silicon carbide single crystal, and an inner-side surface of the guide member and a crystal deposited on the inner-side surface of the guide member in the single crystal growth step" refers to a state where the gap becomes closed and the side surface of the silicon carbide single crystal, and the inner-side surface of the guide member and the crystal deposited on the inner-side surface of the guide member are subsequently unable to be separated again in the gap enlargement step. Local contact to an extent that subsequently enables separation again in the gap enlargement step is permitted. The presence of a "gap" in the present invention is determined according to whether or not the guide member can be rotated after production of the silicon carbide single crystal, and does not depend on whether or not it can be visually observed.

During crystal growth, crystallization (capture of atoms or molecules) and sublimation (detachment) of atoms or molecules are simultaneously occurring on the surfaces of all of the objects placed inside the growth vessel. If the crystallization and sublimation are in competition with each other, neither crystal growth nor etching occurs. Crystal growth proceeds under conditions favoring crystallization, while etching proceeds under conditions favoring sublimation (detachment).

Intuitively, the characteristics of the present invention are such that prior to crystal growth termination, the gap D is enlarged by carrying out a step that creates conditions under which etching of the side surface Wa of the silicon carbide single crystal W or etching of the polycrystal T deposited on the inner-side surface 3b of the guide member 3 occurs. Then, the inventors of the present invention found that, as a specific requirement, the gap D can be enlarged within a realistic timeframe when ΔP (=Pin−Pout) is less than 0.18 torr.

In the present invention, because the gap becomes narrower as the growth period of the silicon carbide single crystal becomes longer, "the single crystal growth step for growing a silicon carbide single crystal in a manner so as to not completely close the gap" is a step for growing the silicon carbide single crystal up to a point before the gap is completely closed. The timing for terminating the single crystal growth step before the gap is completely closed may be arbitrarily selected within the scope of the present invention. The growth of the silicon carbide single crystal involves various factors, but this single crystal growth step is a currently known step for growing a silicon carbide single crystal.

In the single crystal growth step, $\Delta P$ (=Pin−Pout) is generally larger than 0.18 torr, and is typically at least 0.2 torr.

In particular, $\Delta P$ becomes large if extension of the length of single crystals and high-speed growth are to be made compatible. That is to say, extension of the length of a crystal causes the physical distance between Pin and Pout to become larger, and further, Pin becomes large when the growth temperature is increased to achieve high-speed growth. Consequently, these factors cause $\Delta P$ to increase. For example, if a single crystal length greater than 20 mm and a high-speed growth rate of approximately 0.2 mm/h are to be compatible, $\Delta P$ is considered to exceed 0.18 Torr. That is to say, the condition at which extension of the length to a growth amount (single crystal length) of at least 15 mm and a high-speed growth rate of 0.15 mm/h are compatible is a value greater than 0.18 torr, and more generally at least 0.2 torr.

A $\Delta P$ (=Pin−Pout) value exceeding 0.18 torr in the "single crystal growth step" cannot immediately be lowered to 0.18 torr or less (that is to say, the environment inside the crystal vessel cannot be abruptly changed). Therefore, time is required to gradually lower the $\Delta P$ (=Pin−Pout) value toward 0.18 torr or less. As a result, it can be stated that the "gap enlargement step" in the present invention is a step that immediately follows the "single crystal growth step" in those cases the time required to gradually lower the value toward 0.18 torr or less is extremely short. Extremely short may refer to approximately one hour or less for example. On the other hand, in those cases where more time is required to gradually lower the value toward 0.18 torr or less, the "gap enlargement step" refers to the step performed after the time and steps required to gradually lower the value toward 0.18 torr or less have elapsed after the "single crystal growth step", and the value has reached 0.18 torr or less. The time required to gradually lower the value toward 0.18 ton is not particularly limited. Considering the operational effects of the present invention, the "gap enlargement step" in the present invention may take the form of any of the above, and is adequate provided the step is performed before the crystal growth termination step. The temperature may be arbitrarily selected during the "gap enlargement step" such that, for example, the temperature of the source gas in the vicinity of the inlet of the gap and in the vicinity of the outlet of the gap may be lowered gradually or stepwise, or maintained at a fixed temperature.

A specific example of a method for obtaining a $\Delta P$ (=Pin−Pout) value of 0.18 ton or less includes the following. Methods for lowering Pin to achieve the above state include decreasing the output of the heating element, downwardly moving the center of maximum output of the heating element and/or moving a mobile shielding plate between the silicon carbide single crystal and the source. Further, methods for increasing Pout to achieve the above state include providing the heating element to an upper portion of the crucible and raising the output and/or suppressing heat dissipation from the upper portion of the crucible by thermally insulating the upper portion by means of a mobile heat insulation mechanism. The $\Delta P$ (=Pin−Pout) value of 0.18 ton or less may be realized by a combination of the above, or by applying a different method.

The "crystal growth termination step" in the present invention refers to a step for terminating crystal growth by lowering the temperature inside the crucible to a temperature level at which sublimation of the source gas from the source for silicon carbide single crystal growth M does not occur.

The change to this temperature requires time. Therefore, it is not necessary for the process to enter the "crystal growth termination step" immediately after the "gap enlargement step".

In the method for producing a silicon carbide single crystal of the present invention, the gap enlargement step may be performed for 5 hours or more. Although there are no particular limitations in terms of an upper limit, from the perspective of preventing the duration of the entire growth step from becoming too long, 100 hours or less is preferred, 70 hours or less is more preferred, and 50 hours or less is even more preferred.

In the method for producing a silicon carbide single crystal of the present invention, the gap enlargement step may be performed for a period of at least 5% of the total crystal growth time (the duration from starting crystal growth to carrying out the "crystal growth termination step"). Although there are no particular limitations in terms of an upper limit, from the perspective of avoiding the duration of the entire growth step from becoming too long, 70% or less is preferred, 50% or less is more preferred, and 30% or less is even more preferred.

The method for producing a silicon carbide single crystal of the present invention may be a method for producing a silicon carbide single crystal having a length of at least 15 mm. The method for producing a silicon carbide single crystal of the present invention has a particularly significant effect in the production of extended silicon carbide single crystals and high-speed growth.

Although there are no particular limitations in terms of the length of the silicon carbide single crystal, from the perspective of the present invention having a significant effect in the production of extended silicon carbide single crystals, for example, at least 15 mm is preferred, at least 25 mm is more preferred, and at least 40 mm is even more preferred.

In the method for producing a silicon carbide single crystal of the present invention, the temperature difference between the temperature of the source gas in the vicinity of the inlet of the gap and the temperature in the vicinity of the outlet of the gap during the gap enlargement step may be smaller than the temperature difference between the temperature of the source gas in the vicinity of the inlet of the gap and the temperature in the vicinity of the outlet of the gap during the single crystal growth step.

In the method for producing a silicon carbide single crystal of the present invention, there are no particular limitations in terms of the "single crystal growth step". From the perspective of the present invention having a significant effect in the production of silicon carbide single crystals by high-speed growth, for example, an average growth rate of at least 0.15 mm/h is preferred, at least 0.3 mm/h is more preferred, and at least 0.5 mm/h is even more preferred.

Here, the "average growth rate" is represents the growth rate of the silicon carbide single crystal in the single crystal growth step. The "average growth rate" is calculated by subtracting the thickness of the seed crystal from the length (thickness) of the produced silicon carbide single crystal, and then dividing the difference in length by the duration of the single crystal growth step. When calculating the "average growth rate", the time required for single crystal growth does not include the duration of the crystal growth termination step, and further, the transition time from the single crystal growth step to the crystal growth termination step is also not included in those cases a transition time was required.

In the method for producing a silicon carbide single crystal of the present invention, there are no particular limitations on the size of the silicon carbide seed crystal. Along with the expansion in diameter, since a large amount of the source gas is supplied to the growth surface, growth conditions in which Pin is large inevitably become required. From this perspective, a diameter of at least three inches is preferred, at least four inches is more preferred, and at least six inches is even more preferred.

The effects of the present invention have been confirmed using three to six-inch silicon carbide seed crystals.

Figure 4A:
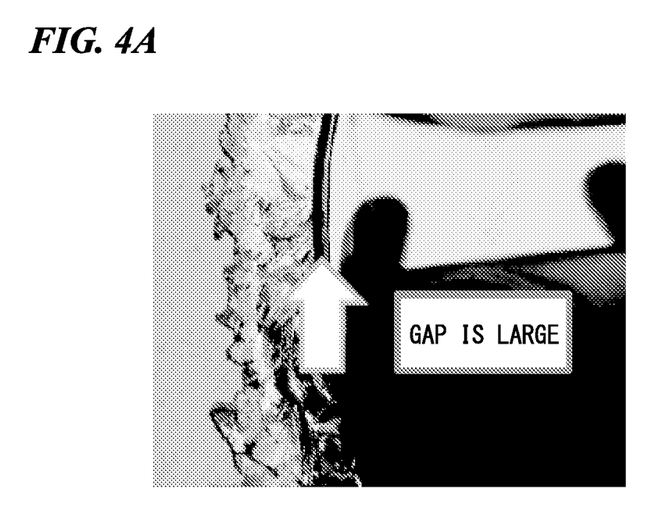
FIG. 4A is a photograph of the vicinity of a gap after crystal growth termination in a case (an example of the present invention) where a gap enlargement step was carried out.
Figure 4B:
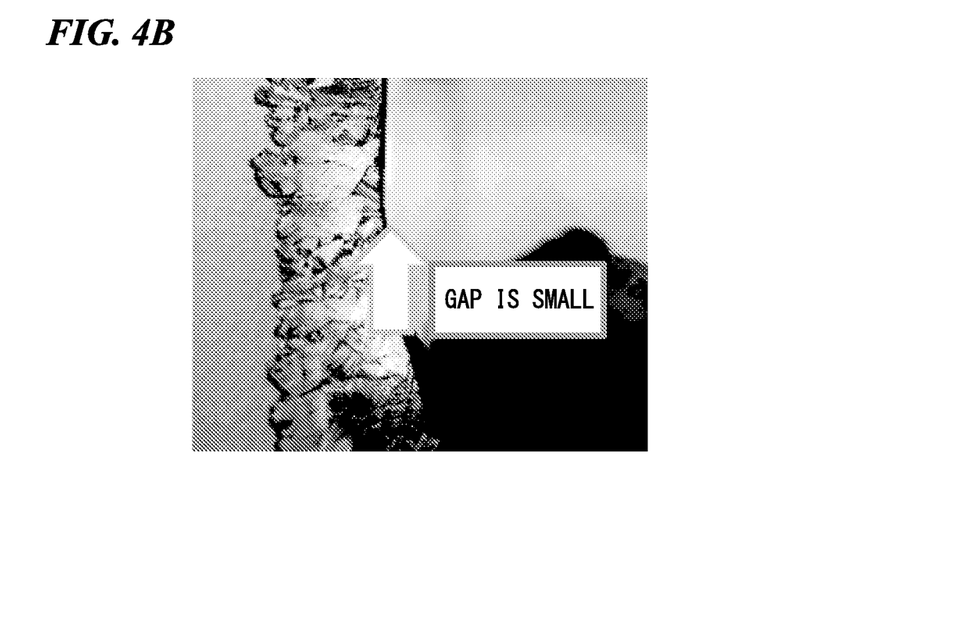
FIG. 4B is a photograph of the vicinity of a gap after crystal growth termination in a case (a comparative example) where a gap enlargement step was not carried out.

FIG. 4A is a photograph showing the size of the gap after crystal growth termination in a case (an example of the present invention) where the gap enlargement step was carried out for 20 hours, and FIG. 4B is a photograph showing the size of the gap after crystal growth termination in a case (a comparative example) where a gap enlargement step was not carried out for 20 hours.

In both cases, a 4H polytype silicon carbide seed crystal having a diameter of four inches was used to grow a 20 mm-long silicon carbide single crystal under the same environment in the growth step, the only difference being the existence of the gap enlargement step.

Compared to the comparative example, it can be seen that the gap in the example of the present invention is clearly enlarged. Cracking occurred in a subsequent crystal cutting step in the case of the comparative example, but cracking did not occur in the case of the example.

Next, experimental and simulation results performed in order to determine the conditions of the gap enlargement step of the present invention are presented.

The results shown in Table 1 are results from performing a plurality of different gap enlargement steps for at least 20 hours.

Figure 3:
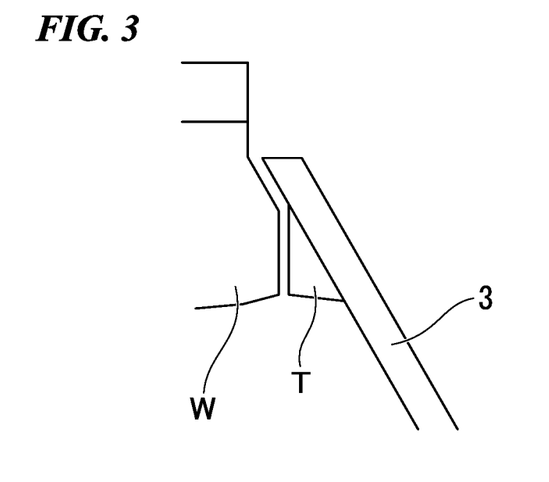
FIG. 3 is a diagram showing one example of a crystal shape read into a simulation software.

After actually growing the silicon carbide single crystal and terminating the growth, the shapes of the completed silicon carbide single crystal and polycrystal that had deposited on the guide member were drawn (see FIG. 3). This drawing was read into the simulation software, including the heating environment and the like. As a result of the simulations, the partial pressure Pin of $Si_2C$ gas in the vicinity of the inlet (IN) of the gap D and the partial pressure Pout of $Si_2C$ gas in the vicinity of the outlet (OUT) were obtained for those shapes. Further, the temperatures in the vicinity of the inlet (IN) of the gap D and the outlet (OUT) were also obtained. In addition, the difference between these temperatures ΔT was also obtained.

The results are shown in Table 1.

TABLE 1

|  | ΔT | ΔP | ΔP* | Gap | Cracking |
| --- | --- | --- | --- | --- | --- |
| Comparative Example 1 | 48.5 | 0.3781 | 0.3774 | x | x |
| Comparative Example 1 | 62.2 | 0.1928 | 0.1922 | x | x |
| Comparative Example 1 | 56.0 | 0.1888 | 0.1865 | x | x |
| Example 1 | 35.4 | 0.1405 | 0.1384 | ○ | ○ |
| Example 2 | 49.9 | 0.1528 | 0.1529 | ○ | ○ |
| Example 3 | 45.2 | 0.0823 | 0.0824 | ○ | ○ |

In Table 1, the difference in the equilibrium vapor pressures ΔP* of $Si_2C$ gas is calculated using a vapor pressure curve from the temperatures in the vicinity of the inlet (IN) of the gap D and in the vicinity of the outlet (OUT) obtained by the simulations. The temperature differences ΔT between the vicinity of the inlet (IN) of the gap D and the vicinity of the outlet (OUT) are also displayed. Further, the difference in the partial pressures ΔP of $Si_2C$ gas represent the pressure differences obtained directly from simulations. The "gap" column in Table 1 depicts those cases where the guide member could be rotated with a symbol (good), and those cases where the guide member could not be rotated with a × symbol (poor), and further, the "cracking" column depicts those cases where cracking did not occur when the cutting step was performed in producing a wafer with a ○ symbol (good), and those cases where cracking occurred with a × symbol (poor).

Figure 5:
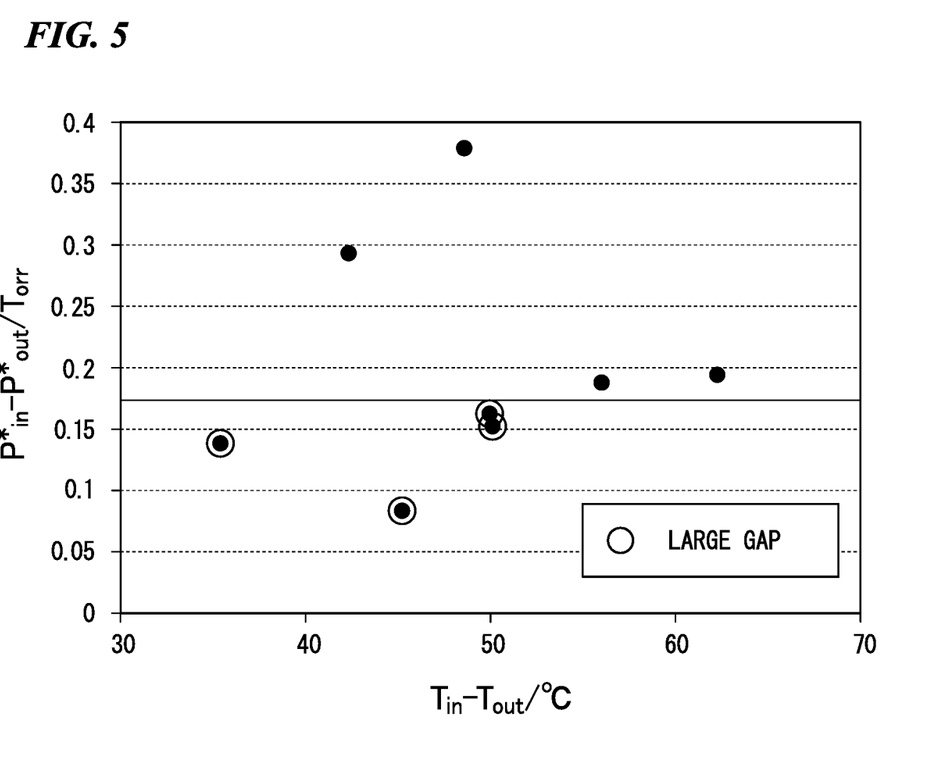
FIG. 5 is a graph showing the results presented in Table 1, wherein the horizontal axis represents ΔT, and the vertical axis represents ΔP*.

FIG. 5 is a graph showing the results presented in Table 1, wherein the horizontal axis represents ΔT, the vertical axis represents ΔP*, and those cases where a ○ symbol is found under the "gap" column are shown enclosed by a circle. FIG. 5 also shows two points in which the "cracking" evaluation was not performed and only the "gap" evaluation was performed.

As shown in Table 1, the difference in the partial pressures ΔP of $Si_2C$ gas is substantially equivalent to the difference in equilibrium vapor pressures ΔP* of $Si_2C$ gas and it is considered that a substantially saturated state is reached in the gap D.

The results in FIG. 5 are substantially unchanged even when the vertical axis is switched to the difference in partial pressures ΔP of $Si_2C$ gas.

It can be seen from Table 1, FIG. 4A, FIG. 4B, and FIG. 5 that when ΔP<0.18, a "gap" is formed to an extent that enables the guide member to be rotated.

INDUSTRIAL APPLICABILITY

A method for producing a silicon carbide single crystal is provided that enables a silicon carbide single crystal having a suppressed occurrence of cracking to be produced.

DESCRIPTION OF THE REFERENCE SIGNS

1: Crucible body
2: Crucible lid
3: Guide member
3a: One end of guide member
3b: Inner-side surface of guide member
3A: Cylindrical portion
3B: Support (guide member)
4: Heating element
10: Crucible
21: Base
21a: One surface of base (seed crystal side surface)
A: Section (section enlarged in FIG. 2)
D: Gap
F: Flow
W: Silicon carbide single crystal (single crystal)
Wa: Side surface of silicon carbide single crystal
S: Silicon carbide seed crystal
T: Polycrystal
M: Source for silicon carbide single crystal growth
$P_{in}$: Partial pressure of $Si_2C$ in source gas in vicinity of inlet of gap
$P_{out}$: Partial pressure of $Si_2C$ in source gas in vicinity of outlet of gap
ΔP: Difference between $P_{in}$ and $P_{out}$
IN: Inlet
OUT: Outlet
100: Silicon carbide single crystal production device

The invention claimed is:

1. A method for producing a silicon carbide single crystal in which a single crystal of silicon carbide is grown on a silicon carbide seed crystal placed inside a crucible by using a guide member to guide a source gas to the silicon carbide seed crystal side, wherein the guide member has one end positioned in the vicinity of the silicon carbide seed crystal, and the method comprising:

a single crystal growth step of growing a silicon carbide single crystal in a manner so as to not completely close a gap between a side surface of the silicon carbide single crystal growing on the silicon carbide seed crystal, and an inner-side surface of the guide member and a crystal deposited on the inner-side surface of the guide member;

a crystal growth termination step of terminating crystal growth by lowering a temperature;

and a gap enlargement step, performed between the single crystal growth step and the crystal growth termination step, of enlarging the gap by maintaining a difference, Pin−Pout, between a partial pressure Pin of $Si_2C$ in a source gas in the vicinity of an inlet of the gap and a partial pressure Pout of $Si_2C$ in a source gas in the vicinity of an outlet of the gap, at 0.18 torr or less.

2. The method for producing a silicon carbide single crystal according to claim 1, wherein the gap enlargement step is performed for at least 5 hours.

3. The method for producing a silicon carbide single crystal according to claim 1, wherein the gap enlargement step is performed for a period of at least 5% of a time required for the total crystal growth.

4. The method for producing a silicon carbide single crystal according to claim 1, wherein a silicon carbide single crystal having a length of at least 15 mm is produced.

5. The method for producing a silicon carbide single crystal according to claim 1, wherein a silicon carbide single crystal is produced at an average growth rate of at least 0.15 mm/h.

6. The method for producing a silicon carbide single crystal according to claim 1, wherein a temperature difference between the temperature of a source gas in the vicinity of an inlet of the gap and the temperature in the vicinity of an outlet of the gap during the gap enlargement step is smaller than the temperature difference between the temperature of a source gas in the vicinity of an inlet of the gap and the temperature in the vicinity of an outlet of the gap during the single crystal growth step.

\* \* \* \* \*